US009396199B1

(12) United States Patent
Bartlett

(10) Patent No.: US 9,396,199 B1
(45) Date of Patent: Jul. 19, 2016

(54) CUSTOMIZABLE AUTOMATED SYSTEM FOR ARCHIVING AND COMPARING THE RESPONSES AND ATTRIBUTES OF MODEL BASED DESIGNS

(71) Applicant: The MathWorks, Inc., Natick, MA (US)

(72) Inventor: Andrew C. Bartlett, Westborough, MA (US)

(73) Assignee: The MathWorks, Inc., Natick, MA (US)

( * ) Notice: Subject to any disclaimer, the term of this patent is extended or adjusted under 35 U.S.C. 154(b) by 441 days.

(21) Appl. No.: 14/077,809

(22) Filed: Nov. 12, 2013

Related U.S. Application Data

(63) Continuation of application No. 11/323,728, filed on Dec. 30, 2005, now abandoned.

(51) Int. Cl.
*G06F 7/00* (2006.01)
*G06F 17/30* (2006.01)

(52) U.S. Cl.
CPC ............................... *G06F 17/30073* (2013.01)

(58) Field of Classification Search
CPC ................................................. G06F 17/30073
See application file for complete search history.

(56) References Cited

U.S. PATENT DOCUMENTS

| 2003/0046641 | A1 | 3/2003 | Fennell et al. |
| 2005/0013462 | A1 | 1/2005 | Rhoads |
| 2005/0174614 | A1 | 8/2005 | Sugaya et al. |

*Primary Examiner* — Ajith Jacob
(74) *Attorney, Agent, or Firm* — Nelson Mullins Riley & Scarborough LLP

(57) ABSTRACT

The present invention provides a method and system for providing customization in choosing what types of model responses are recorded and/or compared. An archive tool is provided so that a user can specify a rule or condition that would trigger the archive of a response. The archive tool can further provide the user with flexibility of how model attributes are stored with the archived response. The stored model attributes can be used to identify a specific archived response. The present invention further provides a browsing mechanism for browsing archives and selecting archives for comparison. Any number of archives may be selected and compared. The selected archives can have their responses plotted individually, together, or passed through analysis functions.

20 Claims, 6 Drawing Sheets

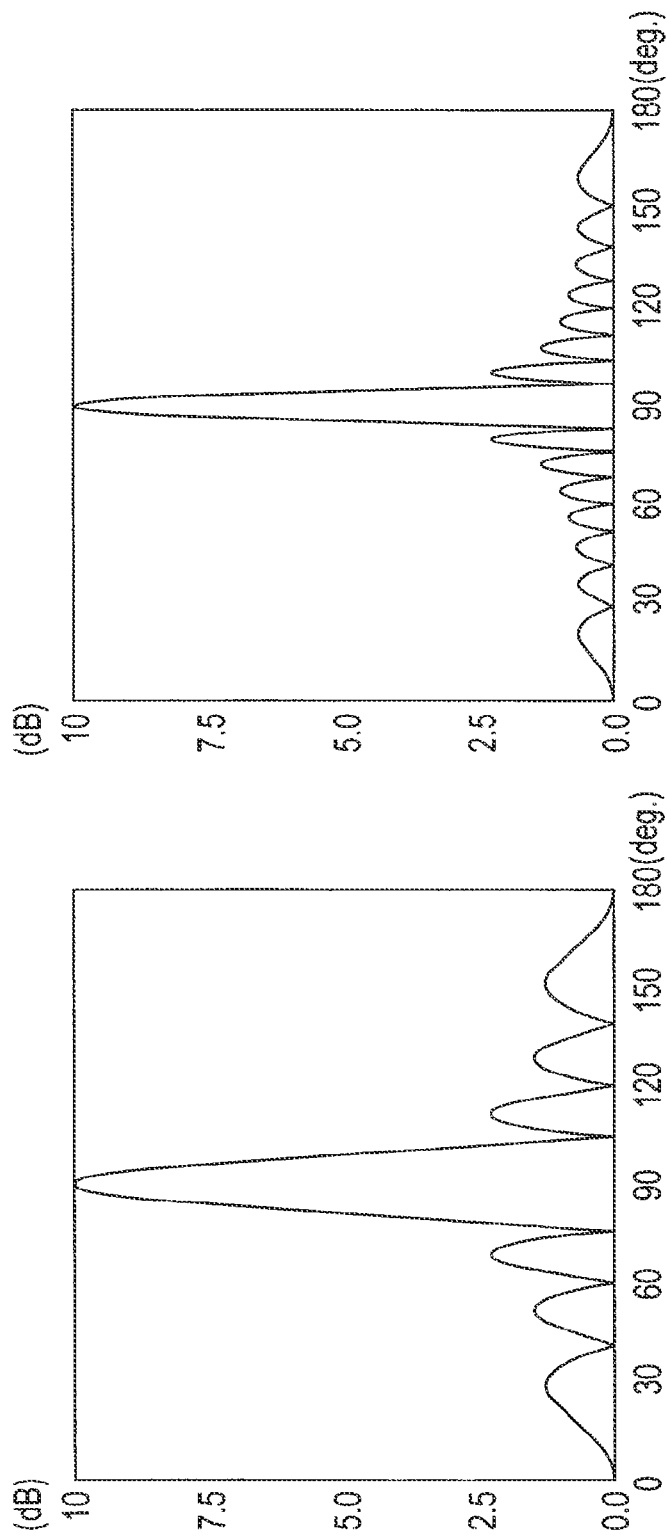

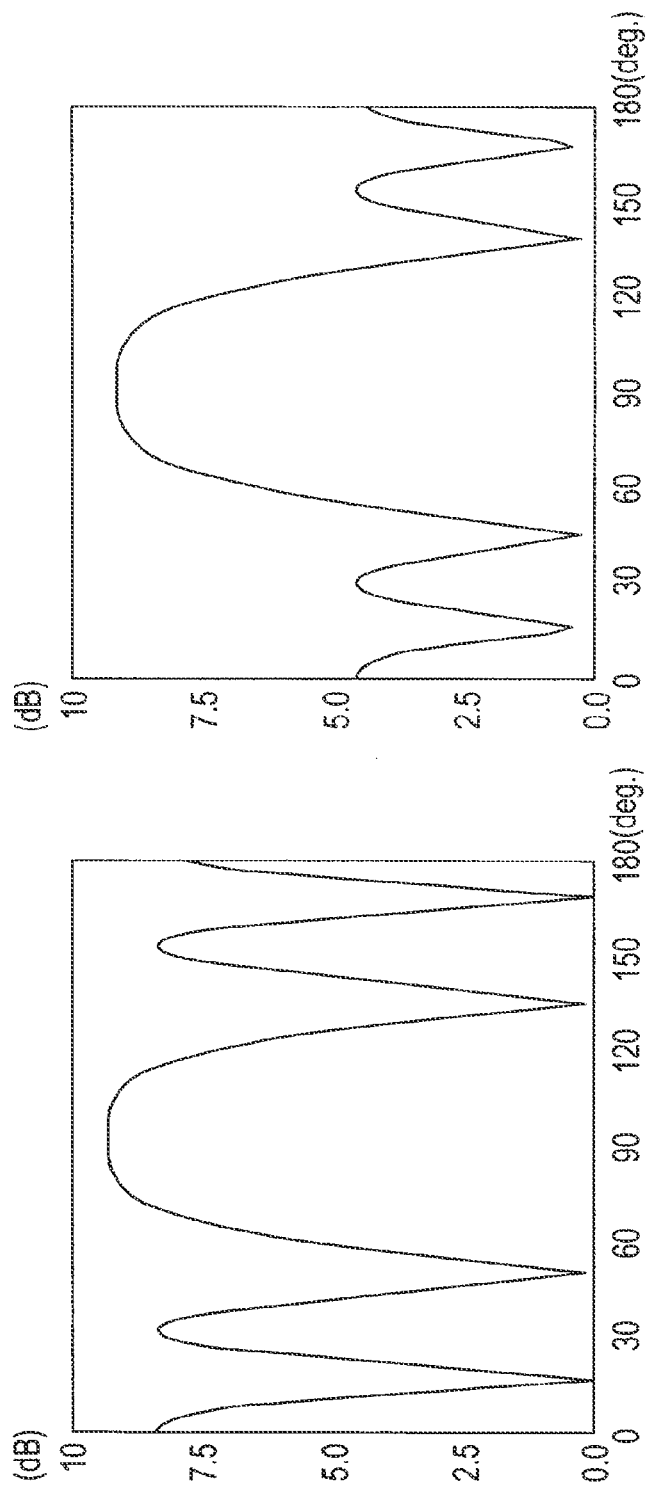

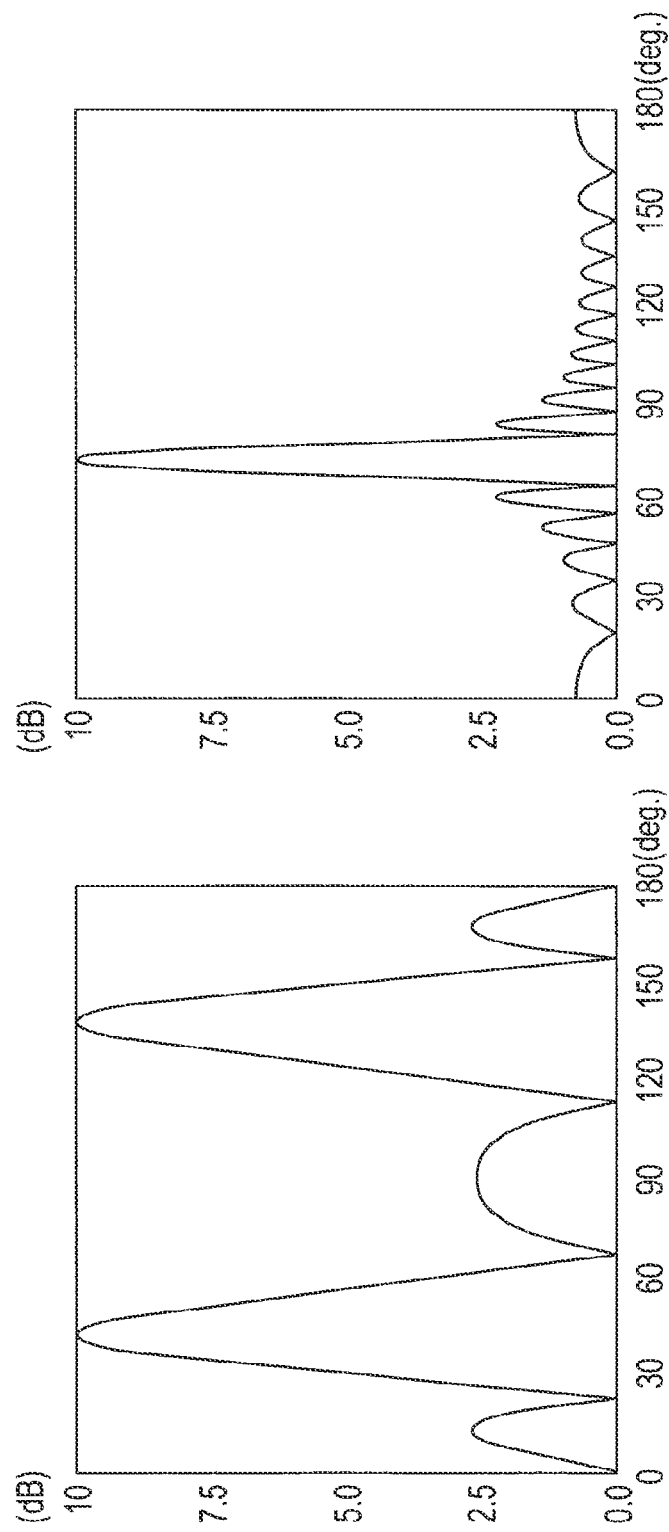

CUSTOMIZABLE AUTOMATED SYSTEM FOR ARCHIVING AND COMPARING THE RESPONSES AND ATTRIBUTES OF MODEL BASED DESIGNS

CROSS REFERENCE APPLICATION

This application is a Continuation of U.S. Ser. No. 11/323,728, filed Dec. 30, 2005, which is hereby incorporated by reference in its entirety.

TECHNICAL FIELD OF THE INVENTION

The present invention generally relates to system responses, and more particularly to storage and comparison of system responses.

BACKGROUND OF THE INVENTION

Generally, graphical analysis, simulation, and execution methods are used in modeling, design, analysis, and synthesis of engineered systems. Some of these methods provide a visual representation of a model, such as a block diagram. The visual representation provides a convenient interpretation of model components and structure. The visual representation also provides a quick intuitive notion of system behavior because the visual representation provides a high level perspective of the system without giving the details of every single step. The components of a block diagram also can capture the mathematical representation of the actual system being modeled, such as a feedback loop.

Various classes of graphical models describe computations that can be performed on computational hardware, such as a computer, microcontroller, FPGA, and custom hardware. Classes of such graphical models include time-based block diagrams such as those found within Simulink® from The MathWorks, Inc. of Natick, Mass., state-based and flow diagrams, such as those found within Stateflow® from The MathWorks, Inc. of Natick, Mass., data-flow diagrams, circuit diagrams, and software diagrams, such as those found in the Unified Modeling Language (UML). A common characteristic among these various forms of graphical models is that they define semantics on how to execute the diagram.

Graphical modeling environments, such as the technical computing environment of MATLAB® from the MathWorks, Inc. of Natick, Mass., can provide a "model-based design" approach to designing an implementation. The term "model-based design" is used to refer to a graphical model acting as a design. A model-based design may be used as a design specification for an implementation, such as an implementation of an algorithm in hardware circuitry or the implementation of code to run on a computer. A graphical block diagram modeling environment can produce designs in graphical block diagram form to specify computations that can be performed on computational hardware such as a general purpose processor, microcontroller, DSP, FPGA, PLD, or ASIC. That is, a model-based design is well suited for use as a design specification, for the model-based design can drive the building process of an implementation of the design. For instance, the model-based design can act as a specification from which to automatically generate code from a graphical model in a graphical modeling environment.

Comparing responses of models after variations have been made is a common task in model based design. However, existing systems are very limited in the type of responses that can be automatically recorded and compared. Typically, a response of a model configured to use floating point and a response of the same model configured to use fixed point can be automatically recorded and easily compared. Other types of comparison of responses are not automated and a user needs to manually record the responses and compare them. Additionally, a user cannot change or customize how the systems determine what type of responses should be recorded and archived.

SUMMARY OF THE INVENTION

The present invention provides a method and system for providing customization in choosing what types of model responses are recorded and/or compared. An archive tool is provided so that a user can specify a rule or condition that would trigger the archive of a response. The archive tool can further provide the user with the flexibility of how model attributes are stored with the archived response. The stored model attributes can be used to identify a specific archived response. The present invention further provides a browsing mechanism for browsing archives and selecting archives for comparison. Any number of archives may be selected and compared. The selected archives can have their responses plotted individually, together, or passed through analysis functions.

In one embodiment of the present invention, a computer-implemented method for archiving a first type of response is provided. The method includes the step of obtaining a condition for a first type of response. The method also includes the step of obtaining a first response generated from a model of the model based design. The method further includes the steps of checking if the first response satisfies the condition and archiving the first response if the condition is satisfied.

The method may further include the step of storing in a storage identification information identifying at least one attribute of the model that generated the first response. The method may also include the step of receiving from a user an attribute of the model to store with the archived first response. The identification information may include the condition for the first type of response. The method may further include the step of replacing an existing archive with the archived first response. The method may also include the step of using a function to calculate a merit score of the first response, wherein the function measures how well the model met design criteria. The method may further include the steps of comparing the merit score of the first response with a merit score of a second response of an existing archive and replacing the existing archive with the archived first response. The step of archiving can be triggered by simulation of the model. A copy of the model may be stored with the archived first response.

In another embodiment of the present invention, a computer implemented method of comparing archives is provided. The method includes the steps of selecting from storage a first archive representing a first response from a first model and selecting from storage a second archive representing a second response from a second model, wherein the selection of the second archive is independent from the selection of the first archive. The method also includes the step of comparing the first response with the second response.

In one aspect of the present invention, the method further includes the steps of selecting from storage a third archive representing a third response from a third model, wherein the selection of the third archive is independent from the selection of the first and second archive and comparing the third archive with the first and second archives. In another aspect of the present invention, both the first and second responses are floating point responses or fixed point responses. In still another aspect of the present invention, the method further includes the step of browsing in storage for the first and second archives. In yet another aspect of the present invention, the method further includes the step of using an analytic function to compare the first and second responses.

In still another embodiment of the present invention, a system for archiving and comparing responses of model based designs are provided. The system includes a technical computing environment for simulating a model and an archiving tool for archiving a response of the model.

In one aspect of the present invention, the system also includes a comparison mechanism for comparing two responses from two different archives. In another aspect of the present invention, the archive tool comprises a customization mechanism for a user to choose at lease one of how a response is archived and what type of response is archived.

In yet another embodiment of the present invention, a computing device including a medium for storing instructions to perform a method for archiving and a first type of response is provided. The method includes the step of obtaining a condition for the first type response of a model based design is automatically archived. The method also includes the step of obtaining a first response generated from a model of the model based design. The method further includes the steps of checking if the first response satisfies the condition and archiving the first response if the condition is satisfied.

In still another embodiment of the present invention, a computing device including a medium for storing instruction for a method of comparing archives is provided. The method includes the steps of selecting from storage a first archive representing a first response from a first model and selecting from storage a second archive representing a second response from a second model, wherein the selection of the second archive is independent from the selection of the first archive. The method also includes the step of comparing the first response with the second response.

BRIEF DESCRIPTION OF THE FIGURES

The foregoing and other objects, aspects, features, and advantages of the invention will become more apparent and may be better understood by referring to the following description taken in conjunction with the accompanying drawings, in which:

FIGS. 4A-F illustrate examples of responses from an antenna radiation model design.

DETAILED DESCRIPTION

Figure 1:
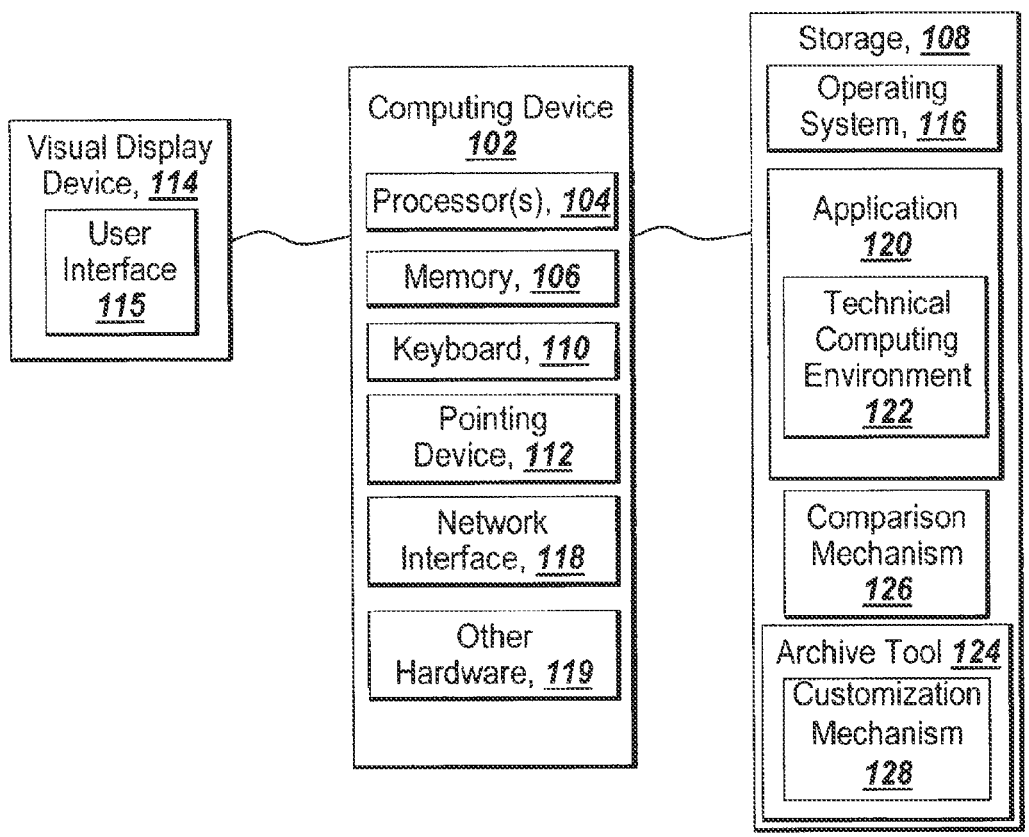
FIG. 1 is a block diagram of a computing device suitable for practicing an embodiment of the present invention.

The present invention provides a method and system for providing customization in choosing what types of model responses are recorded and/or compared. A response includes the input signals and the corresponding behavior of a system or the effect on the system, such as time-series response of a system and frequency response of a system. A signal represents the input and output of a dynamic system. Different inputs to a model representing the dynamic system yield different responses. The present invention allows a user to specify what type of responses should be archived. For example, a user can choose to archive only an intermediate signal and not the input signal or the output signal of the entire system. Alternatively, a user can choose to always archive the input signal. The present invention also allows instrumentation of a model to be archived with the response. Instrumentation is referred herein as the collection of statistics and events that occur during simulation of a model. Instrumentation can include a series of events that would be of interest to a user, such as Block Y had an overflow event occurred at time t and Block X had a division by zero at time $t_1, t_2, \ldots, t_n$. Instrumentation can also include specific statistics, such as, the maximum value of signal Q observed during simulation was 942. Signal Q may or may not have been recorded or archived, but statistics such as maximum and minimum can be stored separately as it can be of interest to the user regardless if the signal itself was recorded or archived. Although the present application is only discussed with respect to a simulation of a model, one of ordinary skill in the art will appreciate that the present invention can be equally applied to execution of a system including simulation of a system, execution of code on an embedded processor or general purpose computation device, execution of code in general, or the like.

An archive tool is provided in the present invention so that a user can specify a rule or condition that would automatically trigger the archive of a response. For example, context status, such as status of operating system, can be used to trigger the automatic archiving of a response. For example, when a simulation is run for a prolonged period of time, it may be desirable to archive intermediate results for every hour. In another example, a non-final response may be archived before a system crash when virtual memory is low on the computing device or when unexpected slow down of the computing device occurs. A rule or condition to archive a response can also be based on other responses that are generated or stored and archived. For example, a condition or rule can be, if the sum of the merit score for responses A and B is higher than a predetermined score, then response C will be archived. The archive tool can further provide the user with the flexibility of how model attributes are stored with the archived response. The stored model attributes can be used to identify a specific archived response. The present invention further provides a browsing mechanism for browsing archives and selecting archives for comparison by a comparison mechanism. Any number of archives may be selected and compared. The selected archives can have their responses plotted individually, together, or passed through analysis functions by the comparison mechanism. Additionally, the comparison mechanism can also compare other items, such as instrumentations and attributes that are stored with the different archived responses. Attributes includes properties, settings, and parameters of the model that generate a specific response. Attributes can be compared in many different ways. For example, attributes that are stored in text files can be compared using standard file comparison tools. Alternatively, if the full model was stored in the archive, then a graphical comparison tool can be launched by the comparison mechanism to compare the different models, so that different elements of the model can be highlighted or otherwise compared graphically.

The comparison mechanism can further provide means to cut, paste, and save various attributes, responses, or models in a single file, graph, or model. In other words, the comparison mechanism can merge two or more text files (including attributes and instrumentations), graphical models, or responses and save the merged result so that it is convenient for the user to see the difference between the two or more text files, graphical models, and responses in one single file, model, or graph. For example, if different models are being graphically compared, then they can be graphically merged into one "merged model".

A user can specify different rules or conditions that the archive tool should use to determine what response should be archived. The rules or conditions can further be used to define categories of responses. One response can fall under one or more categories. Each category can have its own way to calculate a merit score. The browsing mechanism can enable a user to browse for a response under a certain category. Another advantage of the present invention is that a user can setup and customize categories and create new categories.

The illustrative embodiments are described for illustrative purposes relative to a model based design application such as Simulink® from The MathWorks, Inc. of Natick, Mass. Nevertheless, those skilled in the art will appreciate that the principles and concepts described below are equally applicable to other graphical modeling applications, such as Stateflow® and SimEvents from The MathWorks, Inc., LabView® and MATRIXx from National Instruments, Inc., SystemVue™ from Eagleware-Elanix Corporation, HyperSignal® from Hyperception, Inc., COSSAP from Synopsys, Inc., T-Vec® from T-VEC Technologies, Inc., Scade from Esterel Technologies Inc., TargetLink from dSPACE, Inc., Ptolemy from UC Berkeley, Agilent VEE from Agilent Technologies, Inc., and other like graphical model applications. Furthermore, those skilled in the art will also appreciate that the principles and concepts are equally applicable to non-graphical modeling applications as well.

FIG. 1 depicts an environment suitable for practicing an illustrative embodiment of the present invention. The environment includes a computing device 102 having memory 106, on which software according to one embodiment of the present invention may be stored, one or more processor(s) 104 for executing software stored in the memory 106, and other programs for controlling system hardware. Each processor 104 may be a multiple core processor wherein each of the cores may execute portions of the code for practicing embodiments of the present invention. The memory 106 may comprise a computer system memory or random access memory such as DRAM, SRAM, EDO RAM, etc. The memory 106 may comprise other types of memory as well, or combinations thereof. A user may interact with the computing device 102 through a visual display device 114 such as a computer monitor, which may include a user interface 115. The computing device 102 may include other I/O devices such as a keyboard 110 and a pointing device 112, for example a mouse, for receiving input from a user. Optionally, the keyboard 110 and the pointing device 112 may be connected to the visual display device 114. The computing device 102 may include other suitable conventional I/O peripherals. The computing device 102 may further comprise a storage device 108, such as a hard-drive or CD-ROM, for storing an operating system 116, an archive tool 124 including a customization mechanism 128, comparison mechanism 126, and other related software, and for storing application 120, such as Simulink®, including a technical computing environment 122. Those skilled in the art will appreciate that archive tool 124 and comparison mechanism 126 are adaptable to be included as part of the application 120 or a stand alone application that responds to calls from the application 120. Additionally, the operating system 116 and application 120 can be run from a bootable CD, such as, for example, KNOPPIX®, a bootable CD for GNU/Linux.

The computing device 102 may include other hardware 119, such as FPGAs, DSPs, GPPs, and ASICs, for use in practicing the present invention. In some embodiments, this hardware 119 may be used to execute portions of the code used to practice the present invention. One example use of such hardware is to perform hardware acceleration by performing a task more quickly than the processor 104 can.

The archive tool 124 can be implemented as a wizard in application 120 that walks a user through all the different customizations provided by the customization mechanism 128. The wizard asks the user to provide a rule or condition so that the archive tool 124 knows when to automatically archive a response. Additionally, the wizard can also ask the user in what format the user would like the response archived. For example, the user can specify specific model attributes or even the entire model to be archived with the response, so that the user can identify what important parameters yield the specific response. Once a user has provided a rule or condition that a response will be automatically archived, archive tool 124 monitors the simulation of models in the technical computing environment. Once a response of a model satisfied the user defined rule/condition, the response will be automatically archived according to the user specified format.

The archive tool 124 can further archive a response into one or more categories. For example, prior art automatically archives a model's responses into two categories: a floating point category and a fixed point category. The present invention allows more categories and/or user-defined categories to be used. For example, a user may setup a category identification rule that inspect all the data types used within a subsystem of a model. If all the data types in the subsystem are floating-point doubles, then the rule can determine that this simulation run belongs to the "ideal floating point response" category. An alternate category rule could inspect the same subsystem and if none of the data types in that subsystem were floating point type, then the rule can determine that the simulation run should be part of the "fixed point response" category. In another aspect of the present invention, a category can be made depending on a simulation artifact. Other category rule may include, but are not limited to, "single precision floating point response", "16 bit target response", "ASIC target response". Each of the category rules include a condition that the response and its associated model must satisfy before the archive tool 124 can determine if the response should be archived or mapped to a specific category. One advantage of the present invention is that a user can set up, customize, or change rules and conditions on how archive tool 124 is triggered to archive a specific response.

A response generated from a simulation run of a model can be mapped on to multiple categories. For example, a trivial category like "most recent simulation run" can be used together with additional categories, such as "fixed point response". Additional rules can be specified to be utilized only within a specific category. For example, a function can be specified for a category to calculate a merit score before a response can be archived under the category. Each category can use a different measure of merit to trigger the automatic archiving of a response.

One of ordinary skill in the art will appreciate that there are many ways one can choose to implement the different categories for archiving. A category can be in the form of a folder, a database, a property of the archived response, and other forms that are capable of showing a category.

The archive tool 124 further provides a mechanism to browse the stored archives so that a user can choose two or more archives and compare the responses stored in the two or more archives. Comparison mechanism 126 allows the comparison of more than two responses. The comparison is further not limited to only between an ideal response and a fixed point response. Comparison mechanism 126 is able to extract the responses from the archives and perform comparison analysis. Two or more responses can be plotted individually or together. Comparison mechanism 126 can also provide users with different analysis tools to further analyze two or more different responses. For example, statistics can be performed on the response and average error can be determined and shown in a table. In another example, a fuel injector signal could be integrated to approximate the total fuel consumption during a test drive. Comparison mechanism 126 can also allow a user to provide a user defined script that the comparison mechanism 126 will use to compare the two or more responses.

Comparison mechanism 126 can allow a user to save different comparison choices so that the user does not need to re-specify how the comparison mechanism 126 should compare two or more archives. Additionally, comparison mechanism 126 can also provide the option to automatically and intelligently trigger a comparison display. For example, the user may want to always see the "best" fixed point response compared against the ideal floating point response. Comparison mechanism 126 can save this preference and use this preference for further comparison sessions. If a new fixed-point simulation produces a response with the highest merit score, then as this response becomes the "best" fixed point response, not only does the archive tool 124 know to replace the old "best" fixed point response with the new "best" fixed point response, the archive tool 124 notifies the comparison mechanism 126 of this change and the comparison mechanism 126 can automatically display the new "best" fixed point response with the ideal fixed point response for comparison.

In another aspect of the present invention, the comparison mechanism 126 can store many different comparison preferences. A user can choose a stored preference and the comparison mechanism 126 will be able to use the new preference to compare new archived responses and/or retrieve archived responses for comparison. For example, if a user chooses the preference to compare the "best" fixed point response from a set or a category of archived responses with the ideal floating point response, the comparison mechanism 126 is able to select the "best" fixed point response from the set/category of archived response and compare it automatically with the ideal floating point response. In another example, a user can choose a preference to compare two or more archived responses with an analysis tool, the comparison mechanism 126 will then performs the comparison of the two or more archived responses with the specified analysis tool.

Virtualization can be employed in computing device 102 so that infrastructure and resources in the computing device can be shared dynamically. Virtualized processors may also be used with application 120 and other software in storage 104. A virtual machine can be provided to handle a process running on multiple processors so that the process appears to be using only one computing resource rather than multiple. Multiple virtual machines can also be used with one processor.

Still referring to FIG. 1, the computing device 102 may include a network interface 118 to interface to a Local Area Network (LAN), Wide Area Network (WAN) or the Internet through a variety of connections including, but not limited to, standard telephone lines, LAN or WAN links (e.g., T1, T3, 56 kb, X.25), broadband connections (e.g., ISDN, Frame Relay, ATM), wireless connections (e.g., based on 802.11), or some combination of any or all of the above. The network interface 118 may comprise a built-in network adapter, network interface card, PCMCIA network card, card bus network adapter, wireless network adapter, USB network adapter, modem or any other device suitable for interfacing the computing device 102 to any type of network capable of communication and performing the operations described herein. Moreover, the computing device 102 may be any computer system such as a workstation, desktop computer, server, laptop, handheld computer, embedded processor, or other form of computing or telecommunications device that is capable of communication and that has sufficient processor power and memory capacity to perform the operations described herein.

The computing device 102 can be running any operating system such as any of the versions of the Microsoft® Windows® operating systems, the different releases of the Unix and Linux operating systems, any version of the MacOS® for Macintosh computers, any embedded operating system, any real-time operating system, any open source operating system, any proprietary operating system, any operating systems for mobile computing devices, or any other operating system capable of running on the computing device and performing the operations described herein.

Figure 2:
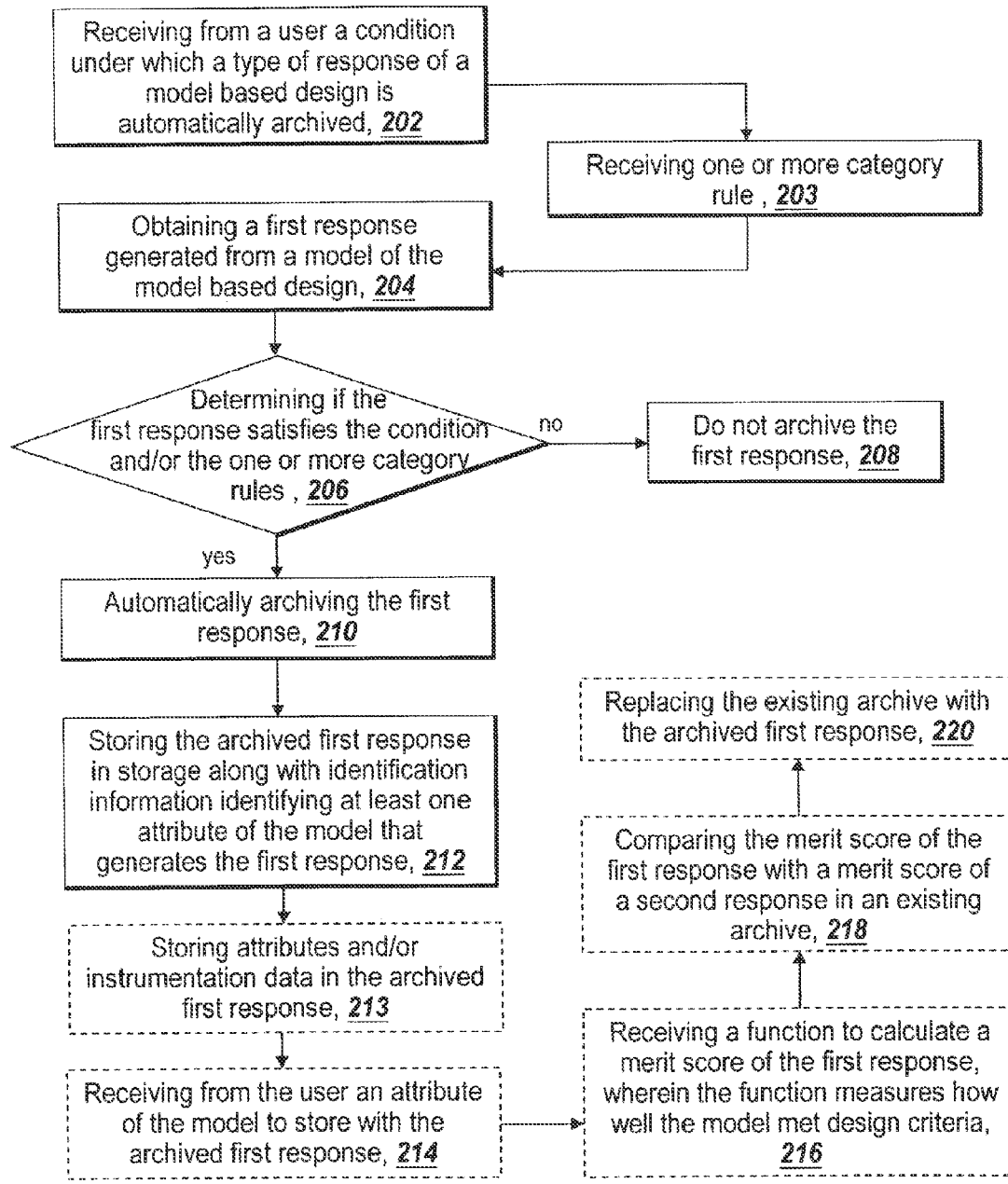
FIG. 2 is a flowchart depicting steps to practice one embodiment of the present invention.

FIG. 2 shows a flow chart depicting steps taken to practice one embodiment of the present invention. In step 202, the archive tool receives from a user specifying a rule or condition that will trigger the automatic archiving of a response. In step 203, the archive tool can optionally receive from a user one or more category rules to archive a response into one or more categories. In step 204, a first response is obtained and generated from a model of a model based design. In step 206, archive tool 124 determines if the first response satisfies the rule or condition. If the rule or condition is not satisfied, the first response is not archived in step 208. Otherwise, the first response is automatically archived in step 210. Hence the present invention relieves a user from manually archiving a response. The present invention also relieves a user from checking if the response should be archived.

The archived first response is then stored in storage in step 212 along with identification information identifying at least one attribute of the model that generates the first response. Additionally, the first response may be transformed before the first response is stored or archived. Transformation techniques can include, but not limited to, encryption, obfuscation, compression, user-specified formatting rule, or a combination thereof. For example, compression techniques can be used to process the archived first response to reduce the archived file size in the storage. In a preferred embodiment of the present invention, archived responses are stored in a database in storage. Other data, such as versions, model configurations, system artifacts, model attributes and/or instrumentation data can also be stored in the archived first response in step 213. A system artifact can be an event that occurs during the simulation of the system, such as an overflow or underflow occurred on a fixed point signal. Fixed point signals have maximum or minimum values that they can represent. For example, a fixed point signal with a value that has eight bits and a slope of 1 with bias 0 can at most hold a value of 255 If a value higher than 255 is computed, archive tool could decides to store the response up to the point where the value is below or equal to 255. Another execution artifact can be model coverage (discussed below). For example, if 100% coverage is achieved of a transition in a state transition diagram, it could be decided to store the response of the state transition diagram or model that contains the state transition diagram. Another example of an execution artifact can be a sample time overrun. For example, if an execution is supposed to compute a task with a certain rate or within a certain time period, but the execution fails because a higher priority task has not been completed yet, the response of the system at that time instance can be stored.

Archive tool can automatically provide versioning of each response that is to be archived. Additionally, archive tool can automatically store data, such as versions, model configurations, model attributes, and/or instrumentation with the corresponding archived response. The archive tool receives from the user information on what attribute to store with the archived first response in step 214. For example, the user can choose to store with the archived response a full copy of the model, a specific set of individual model attributes, dates and time, name of user, location, computer information, software information, sets of scripts and/or scores used to judge the model qualify, etc. In one embodiment of the present invention, a graphical user interface is employed for a user to specify the desired attributes to store with the response in the archive. One of ordinary skill in the art will appreciate that a text based user interface, such as a command line interface, can also be used with the present invention. In one embodiment of the present invention, some of the attributes can be stored in a text file.

In step 216, the archive tool can optionally receive a function to calculate a merit score for the first response. The function may be specified by a user. The merit score can be used to measure how well the model meets design criteria or to measure a property of the response that the user is interested in. The merit score does not need to be represented by a scalar numerical value, but can also be represented by a vector, a symbol, or any representation of a score where there is an ordering among the different scores. Comparisons can be performed by any geometrical distance computation to calculate a merit score. A minimum norm distance computation can be employed to determine the merit score. A Scott domain can also be used to calculate a merit score. The merit score computation can also be based on model coverage results. Model coverage determines which aspects of a model have been excited by the provided input. For example, a state transition diagram may make a transition from one state to another based on a certain condition that contains two disjunctive clauses, A and B. Given a certain input, the A clause may have evaluated to true, and caused the corresponding transition. However, the B clause may never be evaluated to true. The coverage analysis can then determine that the condition based on which the transition was predicated was only covered by 50%. Such coverage results can be established for real signals as well by determining maximum and minimum values of the range of values that a signal has assumed during execution. The coverage results can then be used to compute the merit score.

In step 218, the merit score of the first response can be optionally compared with a merit score of a second response in an existing archive. In one embodiment of the present invention, a user can specify a rule to only keep the archive with the best merit score, hence if the merit score of the first response is better than the merit score of the second response, the existing archive can be replaced with the archived first response in step 220. The merit score can optionally be stored in the archive as well. One of ordinary skill in the art will appreciate that since the merit score is defined by a function or a script written by the user, the merit score can measure any user-defined merit, such as a worse-case difference from an ideal response, an average difference from an ideal response, or any custom scoring scheme. Additionally, one of ordinary skill in the art will appreciate that a user does not have to save only the archive with the best score, but the user can choose to save everything or the user can choose to save only a specific number of archives, such as 10 archives that have the top 10 scores. Hence, the present invention has the advantage that the archive tool can automatically use a function to determine what response to archive and store and the user is relieved from manually determining and comparing the most recent response with all the other existing archives to see if the most recent response should be archived and stored, especially when the user is adjusting many parameters in the model based design. The user can run a series of batch jobs and only the good responses will be automatically archived and stored. Additionally, based on one or more response generated from a simulation of one or more model representing a system, at least one of the one or model can be automatically modified or the input to the one or more model can be automatically changed or selected.

Figure 3:
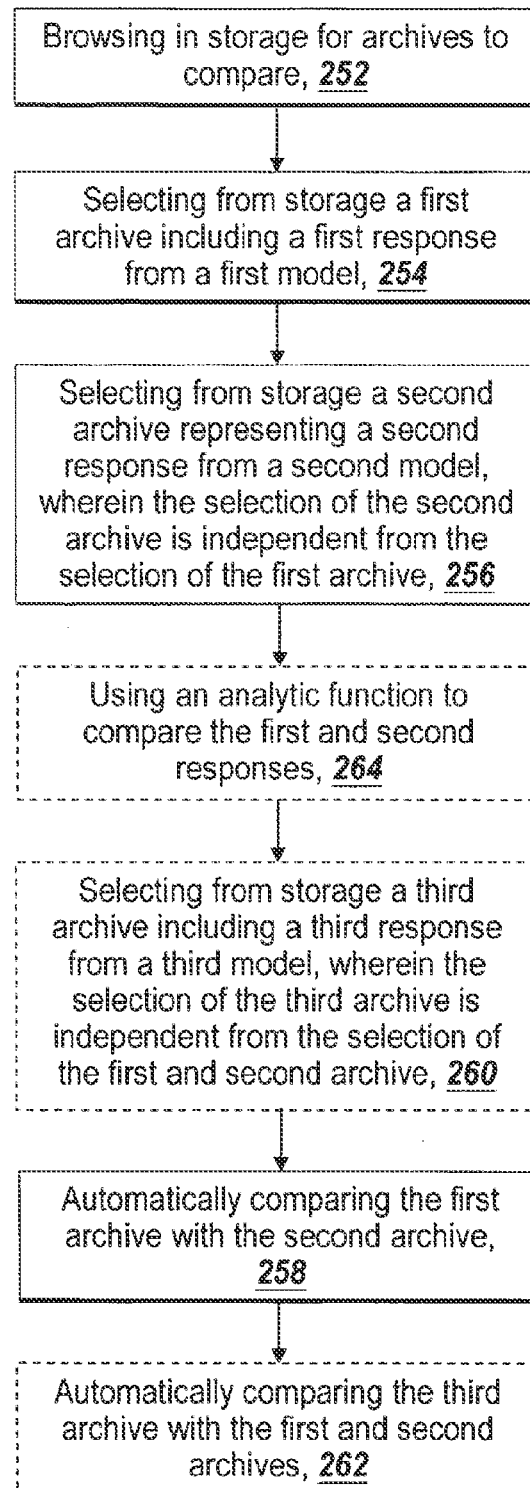
FIG. 3 is a flowchart depicting steps to practice another embodiment of the present invention.

FIG. 3 shows a flow chart depicting steps taken to practice another embodiment of the present invention. In step 252, a user browses in storage for archives to compare. The user can then select from storage a first archive in step 254. The first archive includes a first response from a first model. A second archive is selected in step 256 from storage. The selection of the second archive is independent from the selection of the first archive. In other words, by selecting the first archive, the user is not forced to also select the second archive. Therefore, when the first archive includes a floating point response of a model, the second archive does not have to include an ideal response of the same model.

The user can use analysis tools and functions for comparing the two or more responses in step 264. The two or more responses can be plotted individually or together. A user can determine how to compare the two or more responses by using analysis tools or custom-written script. In step 260, a user selects a third archive. The third archive includes a third response from a third model. The selection of the third model is independent from the selection of the first and/or second archives. In step 258, the first response and the second response are automatically compared. A user can also choose to compare more than two responses. The third response is automatically compared with the first and second responses in step 262.

To better understand the spirit of the claimed invention, an example of an antenna model in an antenna radiation model design is used. One of ordinary skill in the art can appreciate that in a model design, one or more parameters are usually adjusted several times before a designer obtains one or more satisfying results. In the antenna radiation model design, the shape and size of the antenna can affect the radiation pattern. Furthermore, the current in the antenna, the substrate of the antenna, and many other factors can affect the radiation pattern. Additional, if an antenna array is used, then the number of the antennas in the antenna array and the phase difference of the antennas will also affect the radiation pattern. All these parameters that affect the radiation pattern of the antenna radiation model design can be inputs to the antenna model. If a satisfying response is obtained, a user can choose to store these inputs with the response so that the user knows how to reproduce the same response. One or more of these inputs can be used as identification information that identifies at least one attribute of the model that generates the specific response. Other information, such as date and time of the response being generated, the computing device on which the response is generated, one or more specific attributes of the response, or even the entire model with the specific inputs, can be stored or archived with the archived response.

FIGS. 4A-F illustrate exemplary responses generated from the exemplary antenna model of the antenna radiation model design. Assuming that prior to executing the antenna model with different inputs, a user specifies the following condition to decide if a response of the antenna radiation model design should be automatically archived: (1) maximum of radiation pattern occur at $\theta=90°$. Hence, once a response is generated, archive tool 124 checks if the response satisfy the condition and if the condition is satisfied, the response is automatically archived. Therefore, if FIGS. 4A-F are all the responses that are generated, then archive tool 124 will only archive FIGS. 4A-D. The user can choose to specify more than one condition. The user can also use "and", "or", or a combination of "and" and "or" to specify how multiple conditions should be applied. For example, if the user specifies the following conditions: (1) maximum of radiation pattern occurs at θ=90°; and (2) side lobes are at least 3 dB below the main lobe; and (3) the 3 dB beamwidth is at least 30 degrees, then FIG. 4D is the only response that archive tool 124 will archive. However, the user can change how the multiple conditions are applied. For example, if the user specifies the following conditions: (1) maximum of radiation pattern occurs at θ=90°; or (2) side lobes are at least 3 dB below the main lobe; or (3) the 3 dB beamwidth is at least 30 degrees, then all responses shown in FIGS. 4A-F will be archived. One of ordinary skill in the art will appreciate that many different ways can be used to specify a condition. For example, a function can be invoked to specify one or more conditions that a response must satisfy to be archived. Alternatively, a graphical user interface can be employed to specify the conditions using output parameters.

The user can further specify a function to calculate a merit score for each of the generated responses. For example, a user can write a function that gives a specific response 5 points for satisfying condition (1), 3 points for satisfying condition (2), and 2 points for satisfying condition (3). In another example, a user can write a function that gives a response 5 points for satisfying condition (1) and if the maximum is at least 10, then additional 1 point is given. One of ordinary skill in the art will appreciate that there are many different ways a user can write a function to calculate a merit score. Additionally, the user can choose to keep the response with the highest merit score. Hence, for every response that is generated, the response's merit score is calculated and compared with the merit score of the archive storing the response with the highest merit score so far. If the newly generated response has a higher score than the archived response, then archive tool 124 replaces the archived response with the newly generated response.

Many alterations and modifications may be made by those having ordinary skill in the art without departing from the spirit and scope of the invention. Therefore, it must be expressly understood that the illustrated embodiments have been shown only for the purposes of example and should not be taken as limiting the invention, which is defined by the following claims. These claims are to be read as including what they set forth literally and also those equivalent elements which are insubstantially different, even though not identical in other respects to what is shown and described in the above illustrations.

I claim:

1. A method comprising:
    executing a model, the executing comprising:
        evaluating a parameter of the model, and
        producing a measurement by performing an operation using the evaluated parameter, and
        the executing performed using a computing device;
    evaluating a rule, the evaluating comprising:
        identifying a criteria, the criteria used to determine whether the measurement satisfies the rule, and
        the evaluating performed using the computing device;
    determining that the measurement satisfies the rule, the determining performed using the computing device; and
    automatically archiving the measurement based on the determining, the archiving comprising:
        storing the measurement, and
        storing the parameter, and
        the automatically archiving:
            allowing the measurement to be retrieved based on a request, the request identifying the parameter, and performed using the computing device.

2. The method of claim 1, where the automatically archiving further comprises:
    causing the archived measurement to be retrieved based on the parameter, the causing based on a received request.

3. The method of claim 1, wherein the measurement includes a model response.

4. The method of claim 1, wherein the rule comprises a condition, the rule being satisfied when the condition is satisfied.

5. The method of claim 1, further comprising:
    associating a category identifier with the archived measurement, the category identifier used to reference the archived measurement.

6. The method of claim 1, further comprising:
    evaluating a function, the function associated with the rule;
    producing a function output based on the evaluating the function; and
    the determining that the measurement satisfies the rule comprises:
        using the function output to determine that the rule is satisfied.

7. The method of claim 1, further comprising:
    receiving an archive format instruction, the archive format instruction identifying a format for archiving the measurement,
    where the storing the measurement further comprises:
        storing the measurement in a format complying with the archive format instruction.

8. The method of claim 1, where the automatically archiving further comprises:
    determining whether the measurement complies with an archiving criteria, the determining comprising:
        evaluating a plurality of previously archived measurements, the plurality of previously archived measurements related to the executable model or to another executable model, and
        determining that the measurement complies with the archiving criteria, the archiving criteria indicating whether the measurement is to be stored among the plurality of previously archived measurements.

9. A non-transitory computer-readable medium storing:
    one or more instructions that, when executed by one or more processors, cause the one or more processors to:
        receive an instruction to retrieve an archived measurement, where:
            the instruction to retrieve includes a parameter identifier for identifying a parameter associated with the archived measurement,
            the archived measurement is one of a plurality of archived measurements,
            the plurality of archived measurements are produced from one or more executable models, and
            the archived measurement is automatically archived when a rule, associated with one of the one or more executable models, is satisfied;
        process the received instruction to identify the archived measurement, the processing comprising:
            identifying the parameter identifier,
            identifying the archived measurement using the parameter identifier, the archived measurement identified among the plurality of archived measurements; and retrieve the archived measurement based on the processing.

10. The medium of claim 9, wherein the archived measurement is associated with a category.

11. The medium of claim 9, further storing:
one or more instructions that, when executed by the one or more processors, cause the one or more processors to:
retrieve an executable model, the executable model among the one or more executable models, an execution of the executable model generated the archived measurement.

12. The medium of claim 9, wherein the plurality of archived measurements are associated with versioning information and the retrieved measurement includes a version identifier.

13. The medium of claim 9, further storing:
one or more instructions that, when executed by the one or more processors, cause the one or more processors to:
receive an instruction to compare the retrieved measurement with another of the plurality of measurements; and
compare the retrieved measurement with the another of the plurality of measurements based on the received instruction to compare.

14. The medium of claim 11, further comprising:
one or more instructions that, when executed by the one or more processors, cause the one or more processors to:
retrieve an additional archived measurement, where the additional archived measurement is one of a plurality of archived measurements; and
use an analysis function to compare the retrieved measurement and the retrieved additional archived measurement.

15. A device, comprising:
one or more processors executing instructions to:
receive a user input, the user input:
specifying how model attributes are stored in conjunction with a model response, and
customizing a rule, the rule triggering an archive operation performed on the model response,
execute a model, the executing:
evaluating the model attributes,
generating the model response based on the executing, and
associating the model response with the model attributes,
evaluate the rule,
determine whether the model response satisfies the evaluated rule,
automatically archive the model response using the archive operation, the automatically archiving performed when the evaluated rule is satisfied, the archiving comprising:
storing the model attributes, and
storing the model response, and
retrieve the stored model response using the model attributes, the retrieving based on a request.

16. The device of claim 15, wherein the rule comprises a condition, the rule being satisfied when the condition is satisfied.

17. The device of claim 15, wherein a category identifier is associated with the archived model response, the category identifier used to reference the archived model response.

18. The device of claim 15, wherein the one or more processors are executing further instructions to:
evaluate a function, the function associated with the evaluated rule;
produce a function output based on the evaluating the function; and
the determining that the model response satisfies the evaluated rule comprises:
using the function output to determine that the evaluated rule is satisfied.

19. The device of claim 15, wherein the one or more processors are executing further instructions to:
receive an archive format instruction, the archive format instruction identifying a format for archiving the model response and the model attributes,
where the storing the model response further comprises:
storing the model response and the model attributes in a format complying with the archive format instruction.

20. The device of claim 15, wherein the model response is associated with versioning information and the retrieved model response includes a version identifier.

* * * * *